US012645154B2

(12) United States Patent
Wang et al.

(10) Patent No.: US 12,645,154 B2
(45) Date of Patent: Jun. 2, 2026

(54) CHUCK WITH BUFFER PORTION

(71) Applicant: TAIWAN SEMICONDUCTOR MANUFACTURING COMPANY, LTD., Hsinchu (TW)

(72) Inventors: Chien-Wei Wang, Hsinchu County (TW); Wei-Che Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 224 days.

(21) Appl. No.: 18/653,345

(22) Filed: May 2, 2024

(65) Prior Publication Data

US 2025/0341788 A1 Nov. 6, 2025

(51) Int. Cl.
*G03F 7/00* (2006.01)
*G03F 7/16* (2006.01)
*H10P 72/78* (2026.01)

(52) U.S. Cl.
CPC .............. *G03F 7/707* (2013.01); *G03F 7/162* (2013.01); *G03F 7/70783* (2013.01); *H10P 72/78* (2026.01)

(58) Field of Classification Search
CPC ....... G03F 7/162; G03F 7/707; G03F 7/70783
See application file for complete search history.

(56) References Cited

U.S. PATENT DOCUMENTS

| | | | | |
|---|---|---|---|---|
| 3,593,932 | A * | 7/1971 | Altice ................... | B65H 54/543 |
| | | | | 242/486.1 |
| 6,635,335 | B1 * | 10/2003 | Donohoe .......... | H01L 21/32137 |
| | | | | 438/719 |
| 2009/0279101 | A1 * | 11/2009 | Kalkowski ............. | H02N 13/00 |
| | | | | 356/512 |
| 2013/0120897 | A1 * | 5/2013 | Lin ........................ | H02N 13/00 |
| | | | | 216/48 |
| 2024/0160117 | A1 * | 5/2024 | Lubomirsky ..... | H01L 21/67017 |

* cited by examiner

*Primary Examiner* — Deoram Persaud
(74) *Attorney, Agent, or Firm* — Birch, Stewart, Kolasch & Birch, LLP

(57) ABSTRACT

A method of photoresist spin coating process comprises the following steps. A substrate is placed on a chuck using vacuum force or gravitational force. A photoresist chemical is spin coated over the substrate. The chuck comprises a base portion and a buffer portion. The base portion is made of an inorganic material. The buffer portion overlaps the base portion. The buffer portion is more deformable than the base portion, and the buffer portion is made of an organic composite including a polymer and a non-Newtonian fluid.

20 Claims, 10 Drawing Sheets

144b(144)

146

144a(144)

132c-2

144

146

132c-1

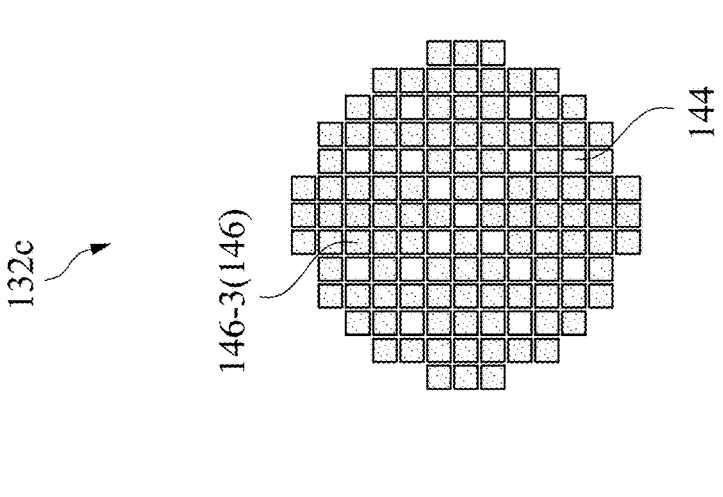
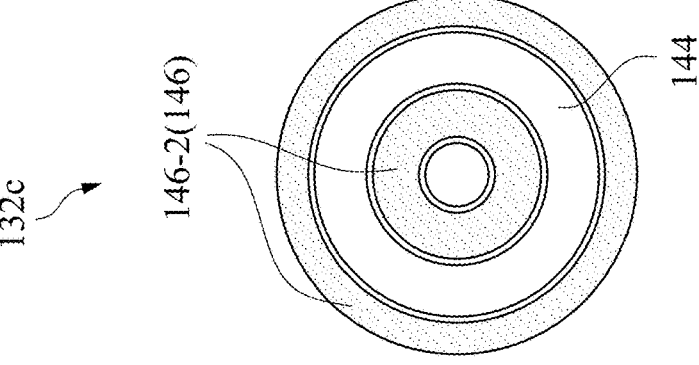
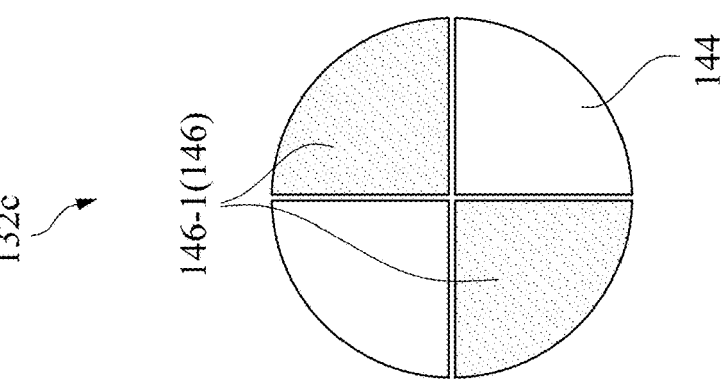
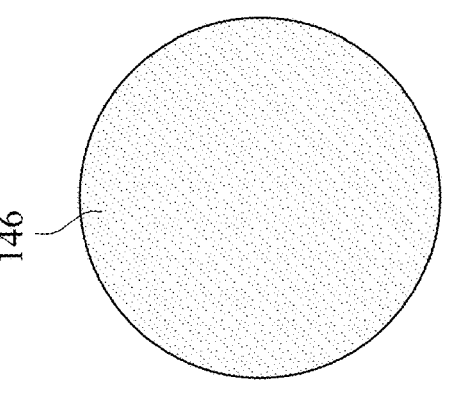
Fig. 3D
Fig. 3C
Fig. 3B
Fig. 3A

CHUCK WITH BUFFER PORTION

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are top views of the chuck in accordance with some embodiments.

DETAILED DESCRIPTION

Figure 1A:
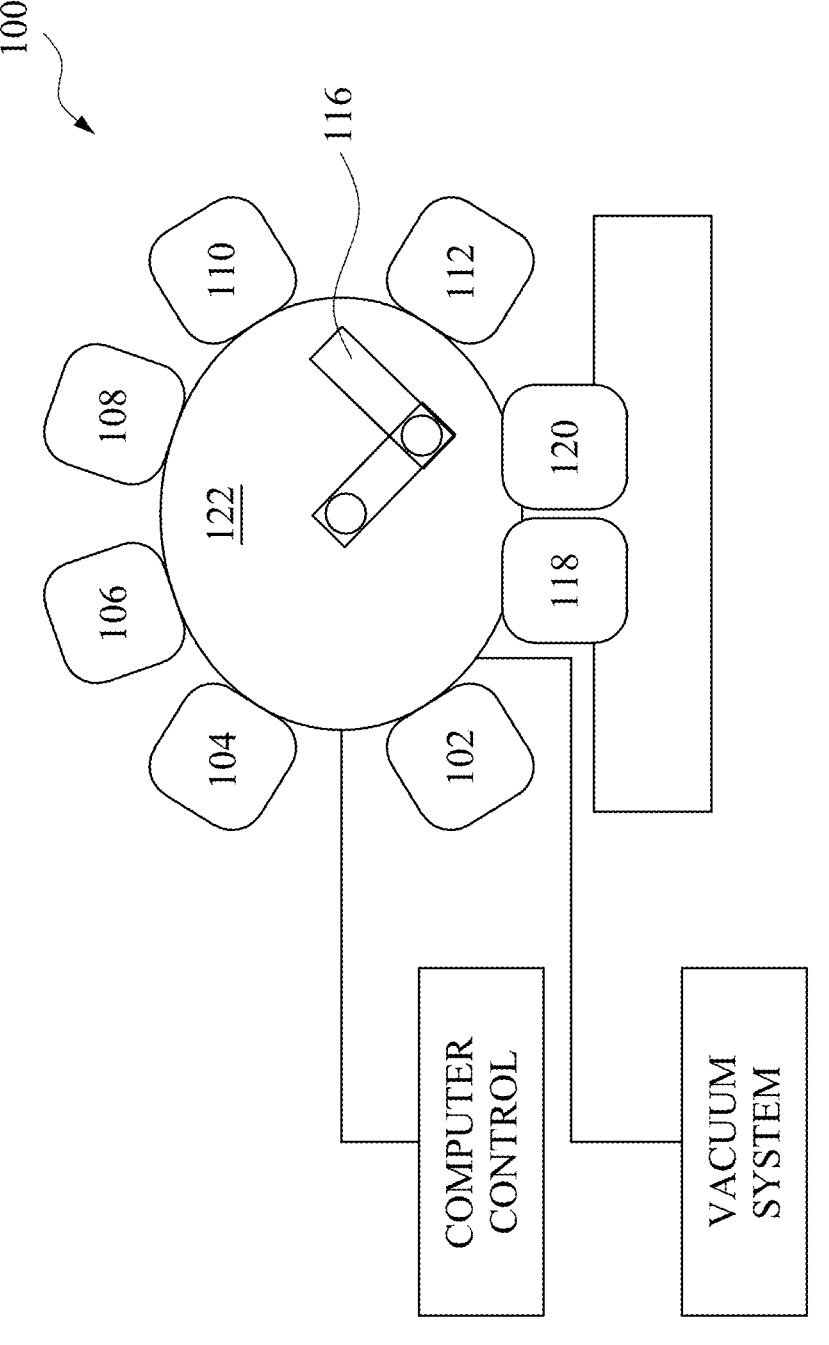
FIGS. 1A-1C are diagrams of a system in which a chuck including a buffer portion and related methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the downscaling of the integrated circuits.

A chuck of a semiconductor processing tool can hold a semiconductor substrate such as a semiconductor wafer, a light emitting diode (LED) glass, a device chip, a printed circuit board (PCB) or the like. The semiconductor substrate may be held on the chuck and in contact with the chuck through a chucking process using vacuum force or gravitational force. One or more processes such as exposure, coating, baking, polishing, or bonding may then be performed to the semiconductor substrate. Since the semiconductor substrate is in contact with the chuck, a flatness of a top surface of the semiconductor substrate may be influenced by the chuck. If the semiconductor substrate on the chuck has a non-uniform flatness, it may suffer performance degradation, for example, coating thickness non-uniformity, exposure focus error, undesired exposure alignment, undesired overlay (OVL), bonding non-uniformity, polish amount non-uniformity, or critical dimension (CD) non-uniformity.

Some embodiments of the present disclosure provide a chuck including a buffer portion which is deformable under a force and can restore after removing the force. Therefore, the substrate on the chuck can have an improved flatness.

Figure 1B:
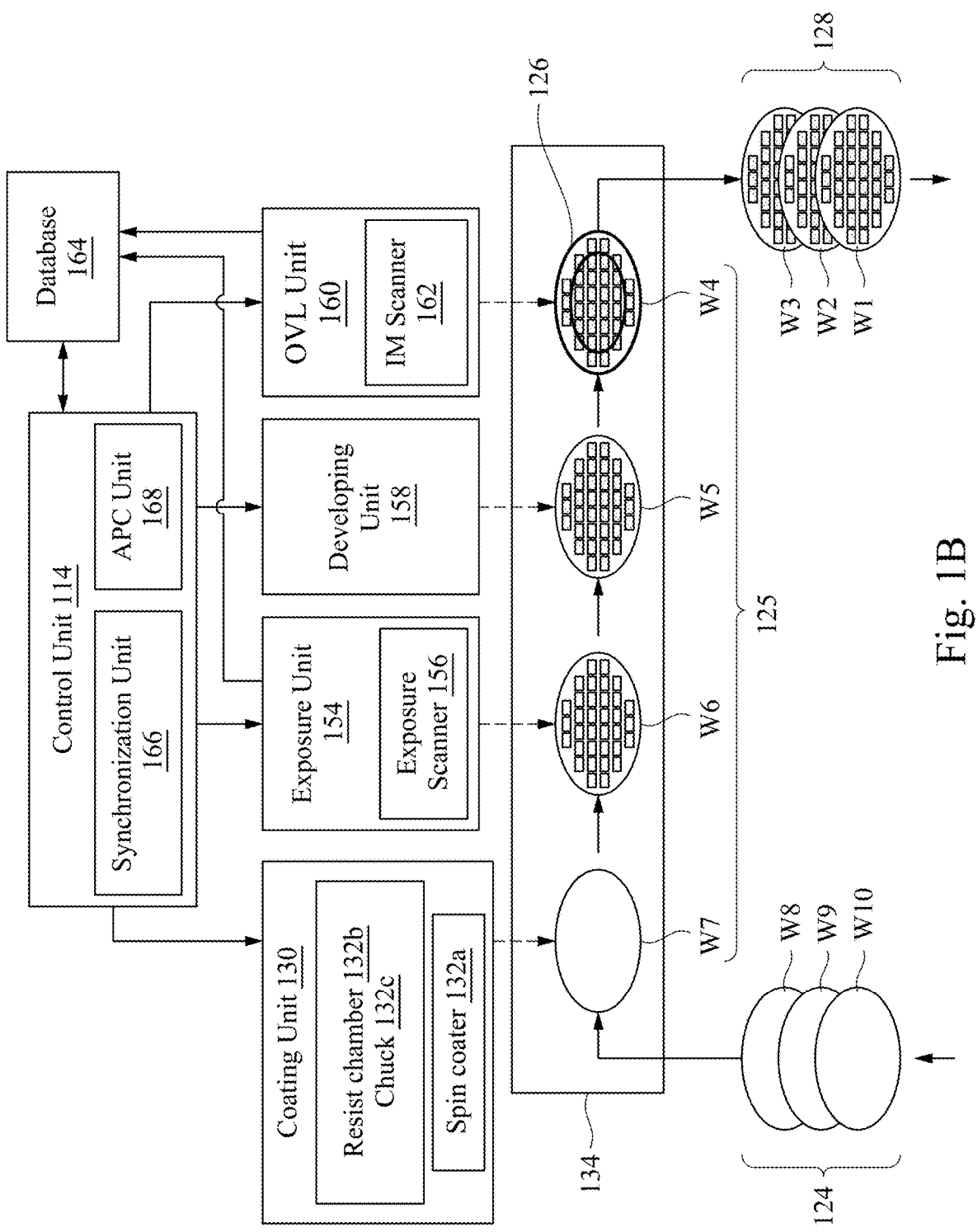
Figure 1C:
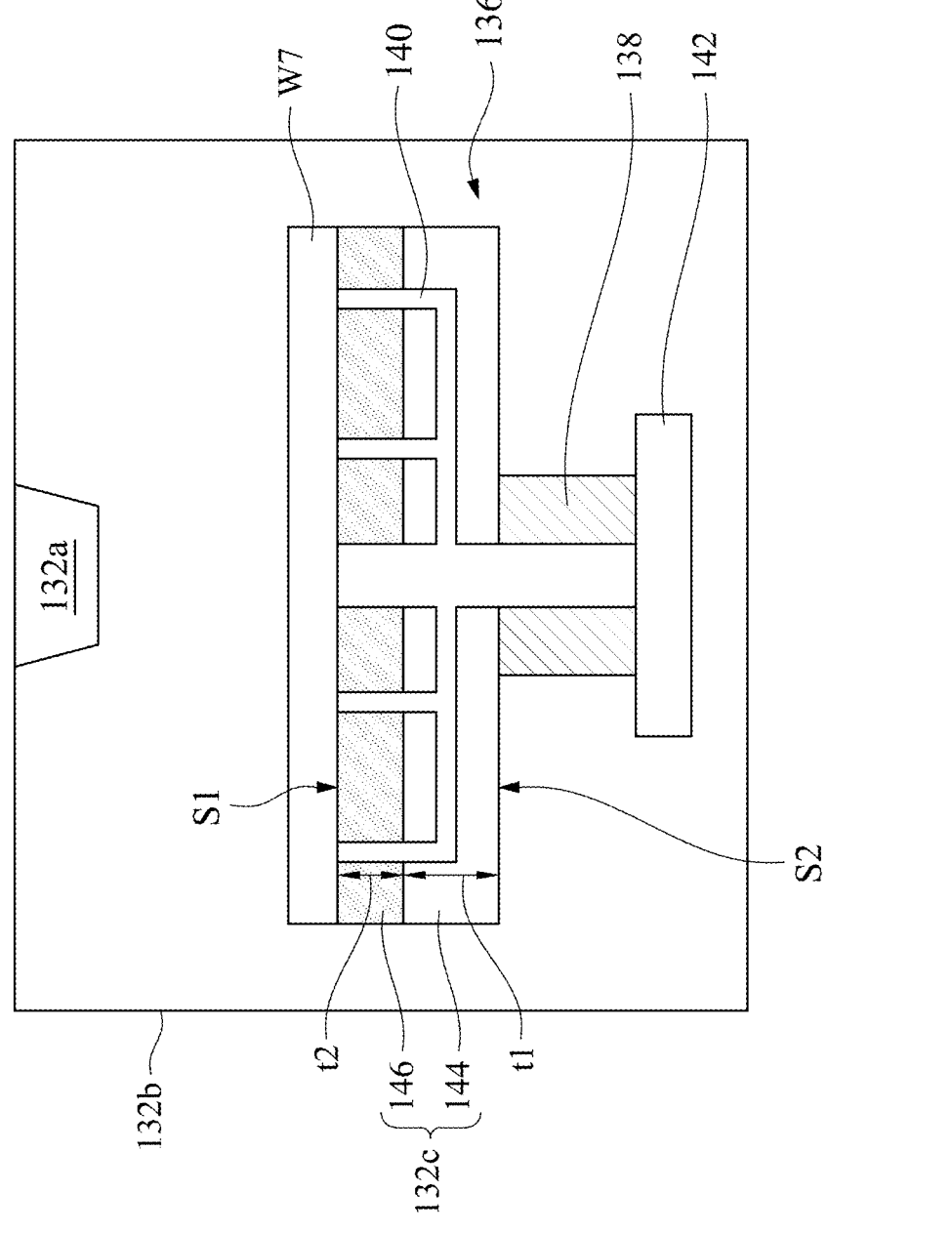

FIGS. 1A-1C are diagrams of a system 100 in which a chuck including a buffer portion and related methods described herein may be implemented. As shown in FIG. 1A, the system 100 may include a plurality of semiconductor processing tools 102, 104, 106, 108, 110 and 112, a wafer/die transport tool 116, load lock chambers 118, 120, and a wafer handling chamber 122.

In some embodiments, the load lock chambers 118 and 120 provide for the transfer of wafers into and out of the system 100. In various embodiments, the system 100 is under vacuum, and the load lock chambers 118 and 120 may "pump down" the wafers introduced into the system 100 (e.g., by way of a mechanical pump and/or a turbomolecular pump). In some embodiments, the load lock chambers 118 and 120 may be adapted to receive a single wafer or a plurality of wafers (e.g., loaded into a cassette). By way of example, the load lock chambers 118 and 120 may be separated from the wafer handling chamber 122 by way of a gate valve, allowing the wafer handling chamber 122 to remain under vacuum when one or both of the load lock chambers 118 and 120 are vented.

The plurality of semiconductor processing tools 102-112 may include deposition tool, an exposure tool, a developer tool, an etch tool, a planarization tool, a bonding tool, an inspection tool, and/or another type of semiconductor processing tool. The semiconductor processing tools 102-112 included in example system 100 may be included in a semiconductor clean room, a semiconductor foundry, a semiconductor processing facility, and/or manufacturing facility, among other examples. The system 100 may be controlled through computer control or another device suitable for automation, and may be connected to a vacuum system.

The deposition tool may be a semiconductor processing tool that includes a semiconductor processing chamber and one or more devices capable of depositing various types of materials onto a semiconductor substrate (e.g., a semiconductor wafer). In some implementations, the deposition tool includes a spin coating tool that is capable of depositing a photoresist layer on the semiconductor substrate. In some implementations, the deposition tool includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool includes a physical vapor deposition (PVD) tool, such as a sputtering tool or another type of PVD tool. In some implementations, the deposition tool includes an epitaxial tool that is configured to form layers and/or regions of a device by epitaxial growth. In some implementations, the example system 100 includes a plurality of types of deposition tools.

The exposure tool is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool includes a scanner, a stepper, or a similar type of exposure tool.

The developer tool is a semiconductor processing tool that is capable of developing a photoresist layer that has been exposed to a radiation source to develop a pattern transferred to the photoresist layer from the exposure tool. In some implementations, the developer tool develops a pattern by removing unexposed portions of a photoresist layer. In some implementations, the developer tool develops a pattern by removing exposed portions of a photoresist layer. In some implementations, the developer tool develops a pattern by dissolving exposed or unexposed portions of a photoresist layer through the use of a chemical developer.

The etch tool is a semiconductor processing tool that is capable of etching various types of materials of a semiconductor substrate or a semiconductor device. For example, the etch tool may include a wet etch tool, a dry etch tool, and/or the like. In some implementations, the etch tool includes a chamber that is filled with an etchant, and the semiconductor substrate is placed in the chamber for a particular time period to remove particular amounts of one or more portions of the semiconductor substrate. In some implementations, the etch tool may etch one or more portions of the semiconductor substrate using a plasma etch or a plasma-assisted etch, which may involve using an ionized gas to isotropically or directionally etch the one or more portions.

The planarization tool is a semiconductor processing tool that is capable of polishing or planarizing various layers of a semiconductor substrate or semiconductor device. For example, a planarization tool may include a chemical mechanical planarization (CMP) tool and/or another type of planarization tool that polishes or planarizes a layer or surface of deposited or plated material. The planarization tool may polish or planarize a surface of a semiconductor device with a combination of chemical and mechanical forces (e.g., chemical etching and free abrasive polishing). The planarization tool may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The bonding tool is a semiconductor processing tool that is capable of bonding a device wafer and a carrier wafer to achieve a semiconductor-on-insulator (SOI) wafer, bonding metal to metal to achieve a bonding interconnect, or other suitable bonding. The bonding tool may be capable of forming three dimensional integrated circuits (3DICs) involving bonding together two semiconductor wafers using fusion bonding, eutectic bonding, and hybrid bonding, as examples.

The inspection tool is a semiconductor processing tool that is capable of inspecting the semiconductor substrate for defects. Defects that the inspection tool may detect include contamination, a bridging of a material, an incorrect feature size (e.g., an incorrect critical dimension) of integrated circuitry formed on the semiconductor substrate, pattern misalignment, overlay misalignment, and/or voids and other types of discontinuities, among other examples. By inspecting the semiconductor substrate for defects, the inspection tool may provide data and/or feedback to maintain process control for one or more of the semiconductor processing tools 102-112. Examples of the inspection tool include a scanning electron microscope (SEM), a transmissive electronic microscope (TEM), and/or another type of electron beam inspection tool, among other examples.

The wafer/die transport tool 116 includes a mobile robot, a robot arm, a tram or rail car, an overhead hoist transport (OHT) system, an automated material-handling system (AMHS), and/or another type of device that is configured to transport semiconductor substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, the wafer/die transport tool 116 may be a programmed device that is configured to travel a particular path and/or may operate semi-autonomously or autonomously. In some implementations, the system 100 includes a plurality of the wafer/die transport tools 116.

For example, the wafer/die transport tool 116 may be included in a cluster tool or another type of tool that includes a plurality of processing chambers, and may be configured to transport semiconductor substrates and/or semiconductor devices between the plurality of processing chambers, to transport semiconductor substrates and/or semiconductor devices between a processing chamber and a buffer area, to transport semiconductor substrates and/or semiconductor devices between a processing chamber and an interface tool such as an equipment front end module (EFEM), and/or to transport semiconductor substrates and/or semiconductor devices between a processing chamber and a transport carrier (e.g., a front opening unified pod (FOUP)), among other examples. In some implementations, the wafer/die transport tool 116 may be included in a multi-chamber (or cluster) deposition tool, which may include a pre-clean processing chamber (e.g., for cleaning or removing oxides, oxidation, and/or other types of contamination or byproducts from a semiconductor substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport semiconductor substrates and/or semiconductor devices between the processing chambers of the deposition tool without breaking or removing a vacuum (or an at least partial vacuum) between the processing chambers and/or between processing operations in the deposition tool, as described herein.

In some implementations, one or more of the semiconductor processing tools 102-112 include a chucking component that supports (e.g., temporarily fixes, temporarily aligns, or temporarily positions, among other examples) the semiconductor substrate during a respective manufacturing process. As an example, the system 100 may be an integrated metrology (IM) system including a chuck 132c, as shown in FIG. 1B. FIG. 1B illustrates a schematic representation of an integrated metrology (IM) system 100a according to some embodiments of the present disclosure. According to the IM system 100a, a set of wafers is arranged to pass through a conveyor apparatus 134, where the wafers go through a set of semiconductor manufacturing and OVL measurement processes. The set of wafers include an incoming set of wafers 124 that are yet to pass through the manufacturing and OVL processing, an outgoing set of wafers 128 that have completed manufacturing and OVL processing, and an active set of wafers 125 that are undergoing manufacturing or OVL processing. The outgoing set of wafers 128 includes wafers W1-W3, the active set of wafers 125 includes wafers W4-W7, and the incoming set of wafers 124 include wafers W8-W10. The chuck 132c can be referred to as a wafer chuck.

The wafers on the conveyor apparatus 134 first pass through a coating unit 130. The coating unit 130 contains a spin coater 132a, which is supplied with various photoresist chemicals contained within a resist chamber 132b. As illustrated in FIG. 1B, the wafer W7 is on the chuck 132c and is disposed below the coating unit 130 to undergo the photoresist coating process. An output from the coating unit 130 is provided to a database 164 which stores all information about the number of wafers that passes through the coating unit 130. The database 164 may include any type of storage device configured to store, data, programs, and other information. In some embodiments, the database 164 may include, for example, one or more of a hard disk drive, a magnetic disk drive, or an optical disk drive.

A control unit 114 controls the coating unit 130 and other parts of the IM system 100a. A two way connection exists between the control unit 114 and the database 164, so that the control unit 114 can provide data to the database 164 as well as adjust the actions of other devices connected to the control unit 114, based on the information provided by the database 164.

FIG. 1C shows a start of the photoresist coating process by placing the wafer W7 on a mounting platform 136. The mounting platform 136 includes a number of different components to help hold and secure the wafer W7. The mounting platform 136 is controllable such that a rate of the photoresist coating process can be controlled. In some embodiments, the mounting platform 136 includes the chuck 132c and a support 138. In some embodiments, the chuck 132c is supported by the support 138 which is controlled by the control unit 114 to move the chuck 132c upwards and downwards. In some embodiments, the support 138 is a motor including a piezoelectric motor, a linear motor, or the like. Alternatively, the motor may include other types of motors. The motor is adapted to adjust an x position, a y position, a z position, and/or an angular position of the wafer W7 relative to the spin coater 132a.

Figure 2B:
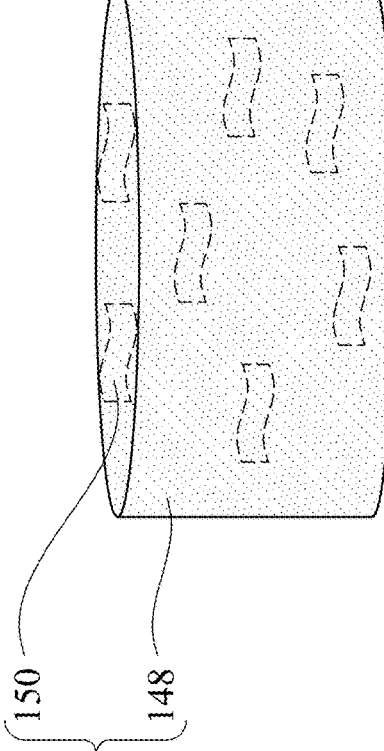
FIG. 2B shows an enlarged view of the buffer portion in accordance with some embodiments.
Figure 2A:
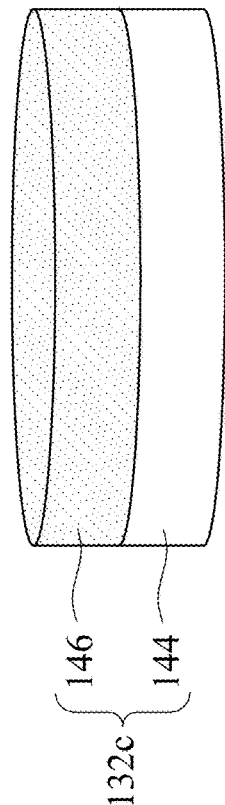
FIG. 2A is a perspective view of the chuck in accordance with some embodiments.

In some embodiments, the chuck 132c has vacuum holes 140 extending vertically from a top surface S1 of the chuck 132c where the wafer W7 is loaded when the wafer W7 is loaded onto and secured to the chuck 132c to a bottom surface S2 of the chuck 132c. In an alternative embodiment, there may be a single vacuum hole 140 at or near a position that corresponds to a precise center of the wafer W7. The vacuum holes 140 are connected to a vacuum pump 142. When the wafer W7 is placed on the top surface S1, the pressure within the vacuum holes 140 are reduced by the vacuum pump 142. The pressure difference between a side of the wafer W7 facing away the vacuum holes 140 and a side of the wafer W7 facing the vacuum holes 140 can hold the wafer on the top surface of the chuck 132c. That is, the wafer W7 may be held on the chuck 132c and in contact with the chuck 132c through a chucking process using vacuum force. In some other embodiments, the wafer W7 may be held on the chuck 132c using gravitational force. The chuck 132c may include a base portion 144 and a buffer portion 146. The chuck 132c is used to support the wafer W7 during the spin coating process. In some embodiments, the base portion 144 has a thickness t1, and the buffer portion 146 has a thickness t2 less than the thickness t1 of the base portion 144 such that the chuck 132c including the buffer portion 146 can still provide structural stability during holding the wafer W7. FIG. 2A is a perspective view of the chuck 132c in accordance with some embodiments. FIG. 2B shows an enlarged view of the buffer portion 146 in accordance with some embodiments. The buffer portion 146 may be an organic material. Details of the chuck 132c will be discussed in greater detail below.

The chuck 132c is used to support the wafer W7 during the spin coating process. In FIGS. 1C and 2A, the chuck 132c has the base portion 144 and the buffer portion 146 over the base portion 144. In some embodiments, the base portion 144 is in physical contact with the buffer portion 146. The base portion 144 has a hardness greater than a hardness of the buffer portion 146, and maintains an overall rigidity of the chuck 132c. The base portion 144 may include an inorganic material. The base portion 144 may include a material such as stainless steel, aluminum, or ceramics. The buffer portion 146 is more deformable than the base portion 144. The buffer portion 146 is deformable under an applied force and can restore after removing the applied force such that the wafer W7 on the chuck 132c can have an improved flatness. Due to the improved flatness of the wafer W7 on the chuck 132c, coating thickness non-uniformity of the wafer W7 can be prevented. The buffer portion 146 may have a Young's modulus in a range from 0.0001 GPa to about 150 GPa, such as in a range from about 0.001 GPa to about 30 GPa.

Referring to FIG. 2B, the buffer portion 146 may be a composite including at least a polymer 148 and at least a non-Newtonian fluid 150. The polymer 148 and the non-Newtonian fluid 150 are more deformable than the stainless steel, aluminum, or ceramics. The non-Newtonian fluid 150 may be more deformable than the polymer 148. The polymer 148 may have a hardness greater than a hardness of the non-Newtonian fluid 150, and can maintain a thickness of the buffer portion 146. The polymer 148 and the non-Newtonian fluid 150 may both be organic materials. In FIG. 2B, the buffer portion 146 has a structure made of the non-Newtonian fluid 150 dispersed in the polymer 148. The non-Newtonian fluid 150 includes a plurality of non-Newtonian fluid portions separately embedded in the polymer 148. In some embodiments, the non-Newtonian fluid portions may be separately embedded in the polymer 148 uniformly. It should be understood that the number of the non-Newtonian fluid portions thereto is not intended to limit embodiments to the particular form disclosed.

In some embodiments, the polymer 148 is a polymer including a glass transition temperature ($T_g$) greater than about 50° C. If the glass transition temperature of the polymer 148 is less than about 50° C., the polymer 148 may not be rigid enough to maintain a desired thickness of the buffer portion 146. For example, the polymer 148 may include poly ester, poly amine, polyamide, polyimide, polynylon, polyurethane, polymer carbonate, polyether, polysaccharide, poly saturated or unsaturated hydrocarbon, polyketone, poly sulfone, polysiloxane, the like, or a combination thereof. The non-Newtonian fluid 150 represents nonlinear response to an external force and is a dilatant fluid. The non-Newtonian fluid 150 may be a polymeric dilatant fluid. The non-Newtonian fluid 150 may include poly ester, poly amine, polyamide, polyimide, polynylon, polyurethane, polymer carbonate, polyether, polysaccharide, poly saturated or unsaturated hydrocarbon, polyketone, poly sulfone, polysiloxane, the like, or a combination thereof. The non-Newtonian fluid 150 may have a glass transition temperature different from the glass transition temperature of the polymer 148. In some embodiments, the glass transition temperature of the non-Newtonian fluid 150 is less than the glass transition temperature of the polymer 148. A ratio of the non-Newtonian fluid 150 to the polymer 148 may be in a range from about 10 volume % (vol %) to about 99.99 volume %, such as in a range from about 0.1 vol % to about 30 vol %. In some embodiment, the base portion 144 and the buffer portion 146 each are single layers.

Figure 2D:
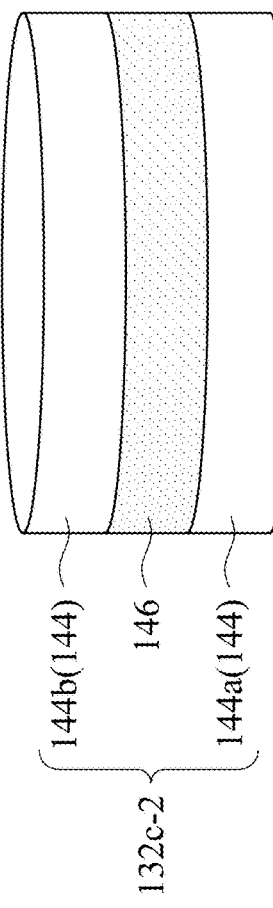
FIGS. 2C-2F are perspective views of the chuck in accordance with some other embodiments.
Figure 2C:
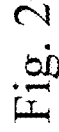
Figure 2E:
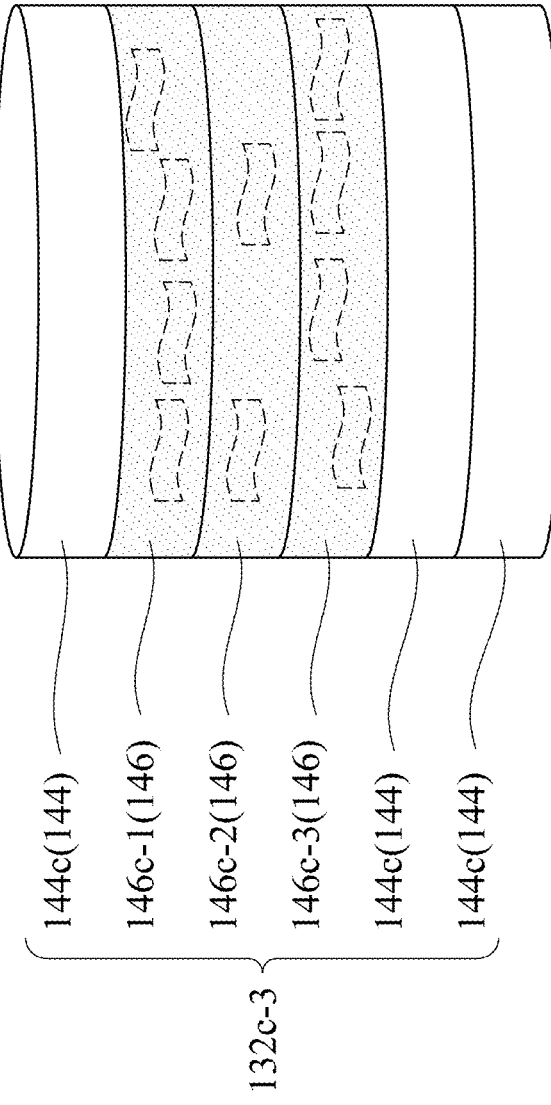

FIGS. 2C-2F are perspective views of the chuck 132c in accordance with some other embodiments. The chuck 132c-1 in FIG. 2C is similar to the chuck 132c in FIG. 2A, except for the buffer portion 146 being below the base portion 144. The chuck 132c-2 in FIG. 2D is similar to the chuck 132c in FIG. 2A, except for the base portion 144 having a first base layer 144a and a second base layer 144b. The buffer portion 146 is sandwiched between the first base layer 144a and the second base layer 144b. The chuck 132c-3 in FIG. 2E is similar to the chuck 132c in FIG. 2A, except for the base portion 144 having a plurality of base layers 144c, and the buffer portion 146 having a top buffer layer 146c-1, a middle buffer layer 146c-2 and a bottom buffer layer 146c-3. The chuck 132c-3 may have the top buffer layer 146c-1, the middle buffer layer 146c-2 and the bottom buffer layer 146c-3 sandwiched between a first group of the plurality of base layers 144c and a second group of the plurality of base layers 144c. In other words, the base portion 144 and the buffer portion 146 each are multilayer stacks.

In some embodiments, the top, middle and bottom buffer layers 146c-1, 146c-2, 146c-3 each includes the same thickness and a deformable property different from one another. For example, the top buffer layer 146c-1 and the bottom buffer layer 146c-3, which are closer to the base layers 144c, are more deformable than the middle buffer layer 146c-2. For example, the top buffer layer 146c-1 has a first ratio of the non-Newtonian fluid to the polymer, and the middle buffer layer 146c-2 has a second ratio of the non-Newtonian fluid to the polymer, and the bottom buffer layer 146c-3 has a third ratio of the non-Newtonian fluid to the polymer. In some embodiments, the first ratio and the third ratio are greater than the second ratio.

Figure 2F:
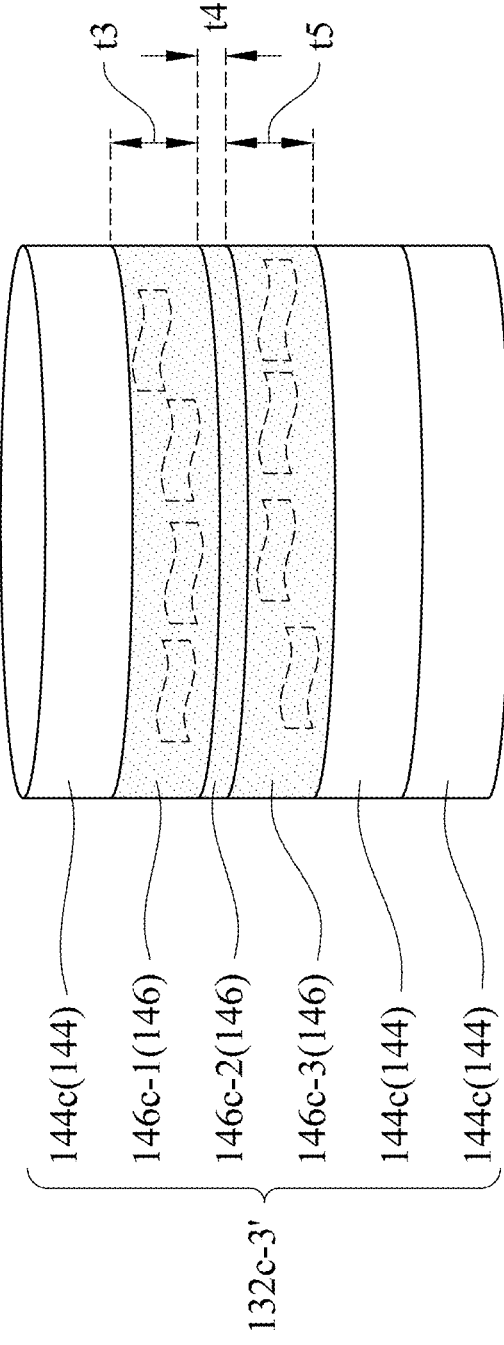

The chuck 132c-3' in FIG. 2F is similar to the chuck 132c-3 in FIG. 2E, except for the thicknesses of the top, middle and bottom buffer layers 146c-1, 146c-2, 146c-3 being different from one another. In FIG. 2F, in some other embodiments, the top buffer layers 146c-1 can have a thickness t3 greater than a thickness t4 of the middle buffer layer 146c-2, and the bottom buffer layer 146c-3 can have a thickness t5 greater than the thickness t4 of middle buffer layer 144c-1.

FIGS. 3A-3D are top views of the chuck 132c in accordance with some embodiments. In some embodiments, the buffer portion 146 may be a single block or a plurality of blocks. For example, in FIG. 3A, the buffer portion 146 is a single block. In FIG. 3B, the buffer portion 146 is made of a plurality of blocks 146-1 with a fan shape. In other words, from the top view, the buffer portion 146 is made of a plurality of fan-shaped blocks 146-1. In FIG. 3C, the buffer portion 146 is made of a plurality of blocks 146-2 with a ring shape. In other words, from the top view, the buffer portion 146 is made of a plurality of ring-shaped blocks 146-2. In FIG. 3D, the buffer portion 146 is made of a plurality of blocks 146-3 with a pixelated shape. In other words, from the top view, the buffer portion 146 is made of a plurality of pixelated-shaped blocks 146-3. In FIGS. 3A-3D, from the top view, an area ratio of the buffer portion 146 to the base portion 144 may be in a range from about 30% to about 100%. In some embodiments, from the top view, the buffer portion 146 covers more than a half area of the base portion 144. For example, the area ratio of the buffer portion 146 to the base portion 144 may be in a range from about 80% to about 100%. For example, from the top view, the buffer portion 146 can substantially overlap the base portion 144 entirely.

Figure 4A:
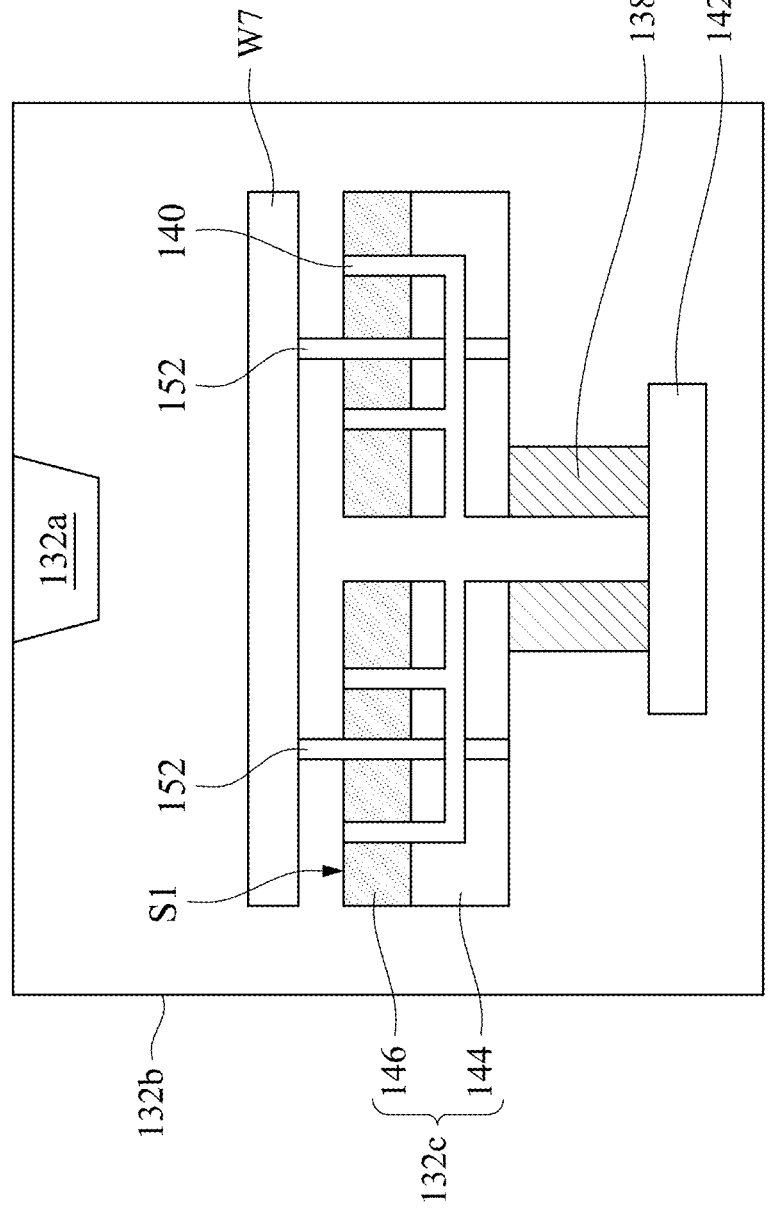
FIGS. 4A-4B show a start of the photoresist coating process by placing the wafer on the mounting platform in accordance with some other embodiments.
Figure 4B:
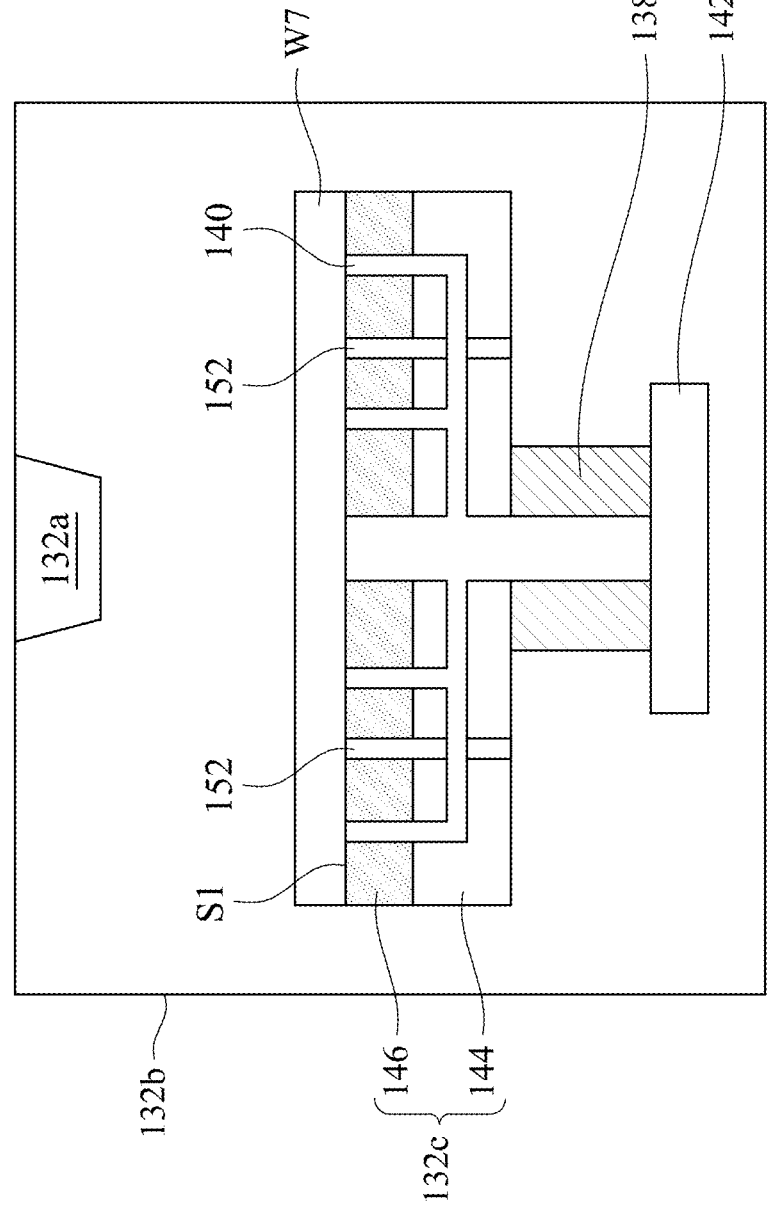

FIGS. 4A-4B show a start of the photoresist coating process by placing the wafer W7 on the mounting platform 136 in accordance with some other embodiments. The chuck 132c may include several lift pins 152 that can be mechanically raised and lowered to control a vertical position of the wafer W7 with respect to the top surface S1 of the chuck 132c. In some embodiments, the motor 138 is coupled to the lift pins 152, and may control a length of a portion of the lift pins 152 that extends through the chuck 132c. For example, in FIG. 4A, at first, the wafer W7 is lifted by the lift pins 152. In FIG. 4B, the wafer W7 is then lowered down and is in contact with the top surface S1 of the chuck 132c by reducing the protruded length of the lift pins 152.

Referring back to FIG. 1B, after undergoing the coating process by the coating unit 130, a wafer on the conveyer apparatus 134 passes through an exposure unit 154. In some embodiments, the exposure unit 154 is housed in a vacuum chamber (not shown), to achieve an ultra-high vacuum, or UHV (e.g., $1\times10^{-12}$ to $1\times10^{-9}$ Torr). Exposure units include an illumination source (not shown) and a photomask or reticle (not shown) between the illumination source and the wafer to be exposed. Modern exposure units include exposure scanners that include movable parts. Exposure scanners increase the length of the area exposed in each exposure shot (exposure field) by moving a reticle stage and a wafer stage in opposite directions to each other during the exposure. Instead of exposing the entire field at once, the exposure is made through an "exposure slit" that is as wide as the exposure field, but only a fraction of its length. In some embodiments, the illumination source comprises an extreme ultraviolet (EUV) tool, or an electron beam direct write (EBDW) tool. The exposure unit 154 includes the exposure scanner 156 which exposed the photoresist coated wafer W6 with a radiation and transferred the pattern on the reticle to the surface of the wafer W6. During exposing, the wafer W6 may be placed on a chuck (not shown) with an improved flatness similar to the chuck 132c to prevent the exposure focus error and undesired exposure alignment. The exposure unit 154 has an output going to the database 164, where information on the number of exposed fields or exposure count is sent to the database 164. Based on this information, the control unit 114 controls the actions of the exposure unit 154.

Once exposed, the wafer on the conveyer apparatus 134 moves to the developing unit 158. Development causes the photoresist coated wafer to dissolve in certain areas according to the amount of light the areas received during exposure. These areas of photoresist and no photoresist reproduce the pattern on the reticle. Wafer W5 disposed below the developing unit 158 is an illustration of a developed wafer.

After developing, the wafer on the conveyor apparatus 134 moves to the OVL metrology unit 160. The OVL metrology unit 160 includes an IM scanner 162 which performs OVL measurements on a developed wafer. The OVL metrology unit 160 has an output going to the database 164 as well as an input coming from the control unit 114. In some embodiments, the control unit 114 comprises a synchronization unit 166 and an automatic process control (APC) unit 168. In another embodiments, the control unit 114 may also include and an application programming interface (API) (not shown). In some embodiments, the APC unit 168 provides stable processing conditions as well as adjusts device properties, and the API provides a unified interface for accessing and interacting with the database 164.

Once the control unit 114 receives an exposure count of a wafer from the exposure scanner 156 (through the database 164), that information is sent to the synchronization unit 166. The synchronization unit 166 has a predetermined set of OVL measurement zone patterns, wherein different OVL measurement zone patterns correspond to different exposure counts. Based on the exposure count received, the synchronization unit 166 selects an OVL measurement zone pattern and instructs the OVL metrology unit 160 to perform OVL measurements within that zone. For example, assume W6 has 100 exposed fields, and the exposure unit 1154 sends an exposure count of 100 to the control unit 114 through the database 164. The synchronization unit 166 picks up an OVL measurement zone pattern, say zone 3 corresponding to the 100 exposure count. This information is sent to the OVL metrology unit 160, and when wafer W6 reaches the OVL metrology unit 160, the IM scanner 162 performs OVL measurements within zone 3 on W6. The number of OVL measurements performed on W6 is proportional to the exposure count 100. Further, the number of OVL measurements performed on W6 corresponds to an OVL measurement time during which the OVL measurements are taken. This OVL measurement time is chosen in a way to offset a difference in the time taken to expose W6 and the incoming wafer W7.

In FIG. 1B, the wafer W4 illustrates an example of a wafer that has undergone IM scanning or OVL measurements within an OVL measurement zone pattern 126. During the IM scanning or the OVL measurements, the wafer W4 may be placed on a chuck (not shown) with an improved flatness similar to the chuck 132c to prevent the undesired overlay (OVL). The zone pattern 126 was chosen by the synchronization unit 166, based on the number of exposed fields on wafer W4, or based on a number of exposed fields or OVL measurements for an immediately processed wafer (e.g., W3). During overlay measurements, the IM scanner 162 is configured to determine locations of a plurality of alignment shapes formed on a patterning apparatus (not shown) relative to first locations of a plurality of first alignment shapes disposed on a surface of the wafer W4.

In some embodiments the OVL metrology unit 160 is further configured to predict an OVL error for each field of a wafer, and send that information to the database 164. The control unit 114 receives the OVL error from the database 164 and the APC unit 168 within the control unit 114. The APC unit 168 can tune the position of the reticle stage (not shown), focus the lens, or change a dose of the illumination source within the exposure unit 154 based upon the values of the OVL error.

The synchronization unit 166 helps in choosing a proportional number of OVL measurement fields for the IM scanner 162 by selecting an appropriate OVL measurement zone pattern (example zone 126). Selecting this zone and performing the right number of OVL measurements will help in smooth functioning of the IM scanner 162, eliminating temperature variations in the exposure scanner 156, and improving the quality of OVL measurements. Furthermore, as more number of wafers pass through the IM system 100a, the OVL error reduces. i.e., control unit 114 is controlling the process tool simultaneously as it receives corrective algorithms from the APC unit 168 based on data obtained after OVL measurements on each wafer. For example, based on the OVL error predicted from wafers W1, W2, etc., corrective measures will be done on the process tools, before wafers W4, W5, etc. get to those process tools (exposure unit 154, developing unit 158, etc.). Thus, after performing OVL measurements, the wafer W10 will have the very little OVL error when compared to the wafer W1 which passed through the OVL measurement first.

It should be noted that the modules and devices in FIG. 1B may all be implemented on one or more processor based systems. Communication between the different modules and devices may vary depending upon how the modules are implemented. If the modules are implemented on one processor based system, data may be saved in a memory or database 164 between the execution of program code for different steps by the control unit 114. The data may then be provided by the control unit 114 accessing the memory or database 164 via a bus during the execution of a respective step. If modules are implemented on different processor based systems or if data is to be provided from another storage system, such as a separate database, data can be provided between the systems through an I/O interface or a network interface. Similarly, data provided by the devices or stages may be input into one or more processor based system by the I/O interface or network interface.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by providing a chuck including a buffer portion which is deformable under a force and can restore after removing the force, the substrate one the chuck can have an improved flatness. Another advantage is that the substrate on the chuck having the improved flatness can prevent performance degradation, for example, a coating thickness non-uniformity, exposure focus error, undesired exposure alignment, undesired overlay (OVL), bonding non-uniformity, polish amount non-uniformity, or critical dimension (CD) non-uniformity.

In some embodiments, a method of photoresist spin coating process comprises the following steps. A substrate is placed on a chuck using vacuum force or gravitational force. A photoresist chemical is spin coated over the substrate. The chuck comprises a base portion and a buffer portion overlapping the base portion. The base portion is made of an inorganic material. The buffer portion is more deformable than the base portion. The buffer portion is made of an organic composite including a polymer and a non-Newtonian fluid. In some embodiments, the non-Newtonian fluid has a glass transition temperature less than a glass transition temperature of the polymer. In some embodiments, the polymer includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof. In some embodiments, the non-Newtonian fluid includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof. In some embodiments, the base portion comprises a first base layer and a second base layer. The buffer portion is sandwiched between the first base layer and the second base layer. In some embodiments, the buffer portion is a multilayer stack. In some embodiments, at least one of the first base layer and the second base layer is a multilayer stack.

In some embodiments, a wafer chuck comprises a base portion and a buffer portion. The base portion is made of an inorganic material. The buffer portion is in physical contact with the base portion. The buffer portion is more deformable than the base portion, and the buffer portion is made of an organic composite including a polymer and a non-Newtonian fluid. In some embodiments, from a top view, the buffer portion is made of a plurality of fan-shaped blocks. In some embodiments, from a top view, the buffer portion is made of a plurality of ring-shaped blocks. In some embodiments, from a top view, the buffer portion is made of a plurality of pixelated-shaped blocks. In some embodiments, from a top view, an area ratio of the buffer portion to the base portion is in a range from about 30% to about 100%. In some embodiments, from a top view, an area ratio of the buffer portion to the base portion is in a range from about 80% to about 100%.

In some embodiments, a wafer chuck comprises a base portion and a buffer portion on the base portion. The base portion is made of ceramic, metal or a combination thereof. The buffer portion comprises a polymer and a non-Newtonian fluid. The non-Newtonian fluid has a glass transition temperature less than a glass transition temperature of the polymer. In some embodiments, the non-Newtonian fluid comprises a plurality of non-Newtonian fluid portions separately embedded in the polymer. In some embodiments, the buffer portion is a multilayer stack. In some embodiments, the polymer includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof. In some embodiments, the non-Newtonian fluid includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof. In some embodiments, from a top view, the buffer portion substantially overlaps the base portion entirely. In some embodiments, from a top view, the buffer portion covers more than a half area of the base portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of photoresist spin coating process, comprising:
   placing a substrate on a chuck using vacuum force or gravitational force, wherein the chuck comprises:
      a base portion, wherein the base portion is made of an inorganic material; and
      a buffer portion overlapping the base portion, wherein the buffer portion is more deformable than the base portion, and the buffer portion is made of an organic composite including a polymer and a non-Newtonian fluid; and
   spin coating a photoresist chemical over the substrate.

2. The method of claim 1, wherein the non-Newtonian fluid has a glass transition temperature less than a glass transition temperature of the polymer.

3. The method of claim 1, wherein the polymer includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof.

4. The method of claim 1, wherein the non-Newtonian fluid includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof.

5. The method of claim 1, wherein the base portion comprises:
   a first base layer; and
   a second base layer, and the buffer portion is sandwiched between the first base layer and the second base layer.

6. The method of claim 5, wherein the buffer portion is a multilayer stack.

7. The method of claim 5, wherein at least one of the first base layer and the second base layer is a multilayer stack.

8. A wafer chuck, comprising:

a base portion, wherein the base portion is made of an inorganic material; and a buffer portion in physical contact with the base portion, wherein:

the buffer portion is more deformable than the base portion, and the buffer portion is made of an organic composite including a polymer and a non-Newtonian fluid.

9. The wafer chuck of claim 8, wherein from a top view, the buffer portion is made of a plurality of fan-shaped blocks.

10. The wafer chuck of claim 8, wherein from a top view, the buffer portion is made of a plurality of ring-shaped blocks.

11. The wafer chuck of claim 8, wherein from a top view, the buffer portion is made of a plurality of pixelated-shaped blocks.

12. The wafer chuck of claim 8, wherein from a top view, an area ratio of the buffer portion to the base portion is in a range from about 30% to about 100%.

13. The wafer chuck of claim 8, wherein from a top view, an area ratio of the buffer portion to the base portion is in a range from about 80% to about 100%.

14. A wafer chuck, comprising:

a base portion made of ceramic, metal or a combination thereof; and a buffer portion on the base portion, wherein the buffer portion comprises:

a polymer; and a non-Newtonian fluid, wherein the non-Newtonian fluid has a glass transition temperature less than a glass transition temperature of the polymer.

15. The wafer chuck of claim 14, wherein the non-Newtonian fluid comprises a plurality of non-Newtonian fluid portions separately embedded in the polymer.

16. The wafer chuck of claim 14, wherein the buffer portion is a multilayer stack.

17. The wafer chuck of claim 14, wherein the polymer includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof.

18. The wafer chuck of claim 14, wherein the non-Newtonian fluid includes poly ester, poly amine, polyamide, polyimide, polynylon, polyurethane, polymer carbonate, polyether, polysaccharide, poly saturated or unsaturated hydrocarbon, polyketone, poly sulfone, polysiloxane, or a combination thereof.

19. The wafer chuck of claim 14, wherein from a top view, the buffer portion substantially overlaps the base portion entirely.

20. The wafer chuck of claim 14, wherein from a top view, the buffer portion covers more than a half area of the base portion.

* * * * *